United States Patent

Kumasaka et al.

[11] Patent Number: 6,092,980
[45] Date of Patent: *Jul. 25, 2000

[54] SUBSTRATE TREATMENT EQUIPMENT AND METHOD WITH TESTING FEATURE

[75] Inventors: Iwao Kumasaka, Aiko-gun; Koji Kubo; Makoto Suzuki, both of Sagamihara; Yuji Tsunoda, Tsukui-gun, all of Japan

[73] Assignee: Tokyo Electron Limited, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/945,484

[22] PCT Filed: Apr. 25, 1996

[86] PCT No.: PCT/JP96/01136

§ 371 Date: Oct. 28, 1997

§ 102(e) Date: Oct. 28, 1997

[87] PCT Pub. No.: WO96/35232

PCT Pub. Date: Nov. 7, 1996

[30] Foreign Application Priority Data

May 1, 1995 [JP] Japan ..................................... 7-132776

[51] Int. Cl.[7] .................................................. H01L 21/66
[52] U.S. Cl. .......................... 414/804; 414/805; 414/147; 414/217; 414/937; 414/939
[58] Field of Search ..................................... 414/217, 805, 414/939, 416, 811, 937, 147, 150, 160, 172, 804

[56] References Cited

U.S. PATENT DOCUMENTS

| | | | |
|---|---|---|---|
| 4,574,263 | 3/1986 | Liddiard | 338/18 |
| 4,678,432 | 7/1987 | Teraoka | 432/12 |
| 4,938,655 | 7/1990 | Asano | 414/811 |
| 5,273,244 | 12/1993 | Ono | 248/176.3 |
| 5,370,709 | 12/1994 | Kobayashi | 29/25.01 |
| 5,423,503 | 6/1995 | Tanaka et al. | 248/277.1 |
| 5,429,498 | 7/1995 | Okase et al. | 432/152 |

FOREIGN PATENT DOCUMENTS

| | | |
|---|---|---|
| 0381338 A2 | 8/1990 | European Pat. Off. . |
| 63-167726 | 11/1988 | Japan . |
| 6-97263 | 9/1992 | Japan . |
| 7-45547 | 2/1995 | Japan . |

OTHER PUBLICATIONS

Abstract, 6–97263 (A), Apr. 8, 1994, Appl. No. 4–265632, Sep. 9, 1992, Wafer Transfer Control System, Kokusai Electric Co., Ltd., Inventor: Ryoji Saito.

Primary Examiner—Robert P. Olszewski
Assistant Examiner—Gerald J. O'Connor
Attorney, Agent, or Firm—Smith, Gambrell & Russell, LLP

[57] ABSTRACT

An exclusive carrier (EQMC) housing therein equipment testing wafers (EQMW) is housed in a carrier housing rack (32) of a treatment equipment. An equipment testing parameter setting section (62) is provided for setting a cycle, in which the equipment testing wafers (EQMW) are carried in a heat treating furnace (21), and the number and holding position of the equipment testing wafers on a wafer boat (23). The equipment testing wafers (EQMW) are held in dummy wafer holding regions (D) at the upper and lower end portions of the wafer boat (23) to be heat-treated in the set cycle. After the heat treatments of all the equipment testing wafers (EQMW) in the equipment testing carrier (EQMC) are completed, the wafers (EQMW) are transferred to a detecting device, and the state of the treatment equipment is grasped on the basis of the treated state. Thus, when semiconductor wafers are treated by means of a batch heat treatment equipment, the state of the treatment equipment can be tested by means of the equipment testing wafer, and the treatment equipment can be easily used.

9 Claims, 6 Drawing Sheets

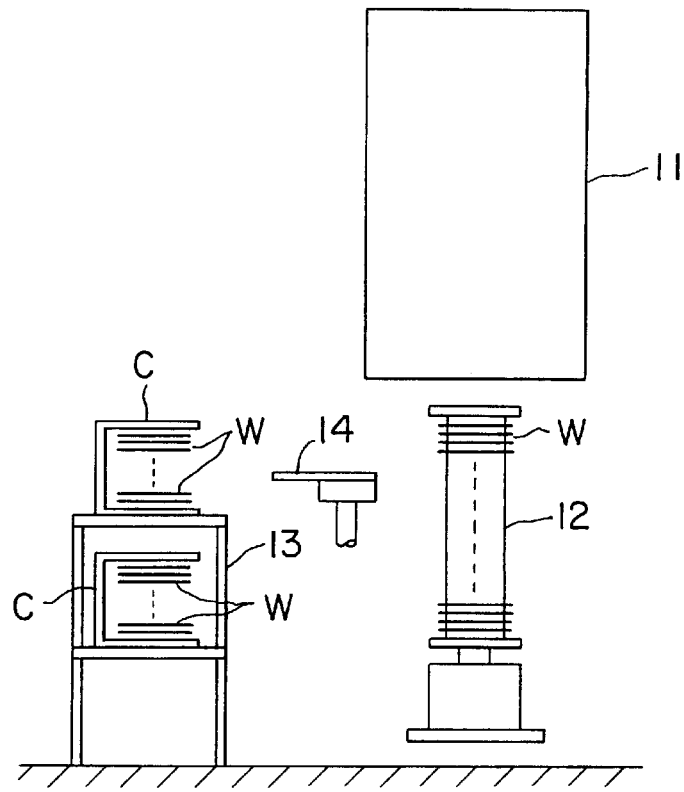
F I G. 8
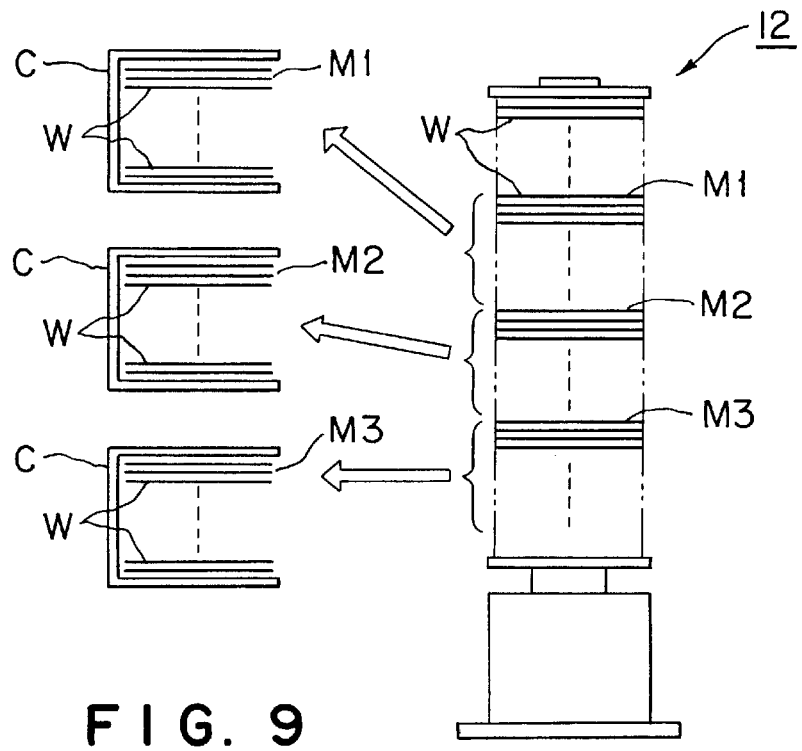
F I G. 9

SUBSTRATE TREATMENT EQUIPMENT AND METHOD WITH TESTING FEATURE

BACKGROUND OF THE INVENTION

1. Field of The Invention

The present invention relates generally to a treatment method for treating an object to be treated and a treatment equipment therefor.

2. Description of The Prior Art

Important processes for manufacturing objects to be treated, e.g., semiconductor wafers, include heat treatment processes. Such heat treatment processes include, e.g., formation of oxide films on semiconductor wafers, diffusion of dopant, annealing and CVD. In recent years, vertical treatment equipment (vertical treating furnace) has been often used in the heat treatment processes in place of horizontal treating furnaces, since vertical treatment equipment has the advantage of small entrainment of air and so forth.

As shown in FIG. 8, such a vertical treatment equipment comprises: a vertical heat treating furnace 11; a wafer boat 12 serving as a wafer holder for holding a plurality of wafers W arranged so as to be vertically apart from each other at regular intervals; a delivery rack 13 for mounting thereon a wafer carrier (which will be hereinafter simply referred to as a "carrier") C to deliver the wafers W; a carrier inlet/outlet port (not shown); a carrier stocker (not shown) and so forth. The wafers W in the carrier C mounted on the delivery rack 13 are transferred to the wafer boat 12 by means of an arm 14 of a transfer robot. After a predetermined number of wafers are loaded on the wafer boat 12, the wafer boat 12 is moved upwards to be carried in the heat treating furnace 11 by means of a boat elevator (not shown), so that a predetermined heat treatment of the wafers W is carried out in the heat treating furnace 11.

The upper and lower end portions of the wafer boat 12 have a lower temperature than those of other portions of the wafer boat 12 due to the structure of the heat treating furnace 11. Therefore, in order to avoid the ununiformity of treatment between the wafers W, dummy wafers are usually arranged at the upper and lower end portions of the wafer boat 12, and wafers to be treated are usually loaded at the other portions of the wafer boat 12.

For example, in a case where wafers W arranged at a certain lot are heat-treated, in order to prevent the subsequent processes of the wafers W at that lot from being wasted, it is required to preliminarily determine if a predetermined heat treatment was carried out. Therefore, in conventional wafer monitoring methods, a monitor wafer W is loaded in a wafer loading region of the wafer boat 12, in which the wafers to be treated are loaded. After heat treatment, the monitor wafer is inspected to indirectly grasp the treated state of wafers to be treated, which have been heat-treated with the monitor wafer.

FIG. 9 shows an example of a conventional monitoring method for monitoring wafers to be treated. In this method, for example, a monitor wafer M1 (M2, M3), together with wafers W to be treated, is housed in a carrier C. After heat treatment, the respective wafers W are returned to the original carrier, and the treated state of the monitor wafer M1 (M2, M3) is inspected to indirectly grasp, e.g., the treated state of the wafers W to be treated, which are contained in the carrier C housing therein the monitor wafer M1 (M2, M3), so that it is determined whether the wafers W to be treated should proceed to the next process.

The heat treatment conditions in the heat treatment equipment are not always stable, and may be suddenly or gradually deteriorated. Therefore, in order to prevent wasteful processes from being subsequently carried out or in order to prevent the operation of the heat treatment equipment from being stopped in a usual operating time zone, it is important to always monitor the state of the heat treatment equipment. However, according to the conventional heat treatment methods, it is very inconvenient to always monitor the heat treatment equipment for the following reasons. Since the reference level of the process for inspecting the state of heat treatment, e.g., the in-plane uniformity of the thicknesses of the wafers and the number of particles thereof, on the basis of the monitor wafer is different from that of the process for inspecting the state of the heat treatment equipment, it is difficult to carry out these inspection processes by a single stage of inspection. For that reason, two stages of inspection processes must be always carried out to inspect the state of the heat treatment equipment using the monitor wafer. Thus, the inspection for both heat treatment and equipment testing is performed on the same monitor wafer known in the art. The inspection of the wafer occurs after removal of the heat treatment equipment so that the wafers must be moved from the processing during the inspection. Therefore, during the inspection processes, the wafers to be treated, which are arranged in the lot containing the monitor wafer, can not proceed to the next process, so that the through put of the whole process is lowered.

In addition, if a sequence monitor for inspecting the state of the equipment on the base of the monitor wafer in a certain cycle, i.e., every few processes, is carried out, the operator must count the number of processes and supply a monitor wafer to the inspection process of the state of the equipment every time the predetermined number of processes is carried out, so that the operator's work is complicated. Moreover, if it is determined in accordance with the number of processes whether the monitor wafer proceeds to the next process after inspecting the treated state or after inspecting the state of the equipment, it is very difficult to apply this to the a mass production process. For that reason, the state of the equipment has not been adequately monitored.

Thus, in the conventional heat treatment methods, there is lacking the required monitoring for keeping abreast with the state of the equipment. Accordingly, periodic maintenance is carried out or maintenance is carried out after the operation of the equipment is stopped when abnormal data continuously appears.

SUMMARY OF THE INVENTION

It is therefore an object of the present invention to eliminate or avoid the aforementioned problems and to provide a treatment method and a treatment equipment, which can conveniently test the state of the equipment and which can be easily used.

In order to accomplish the aforementioned and other objects, according to one aspect of the present invention, there is provided a method for carrying a substrate to be treated, in a treatment vessel to treat the substrate, the method comprising the steps of: setting a treating cycle of an equipment testing substrate serving to test a state of a treatment equipment; taking the equipment testing substrate out of an exclusive carrier to carry the equipment testing substrate in a treatment vessel to treat the equipment testing substrate therein, in a preset treating cycle during the step of treating a substrate to be treated; carrying the treated equipment testing substrate in the exclusive carrier; and testing the state of the treatment equipment on the basis of the treated state of the treated equipment testing substrate housed in the exclusive carrier.

According to the present invention, equipment testing substrates are housed in an exclusive carrier, and the equipment testing substrates are treated every time processes are carried out in a preset treating cycle n, i.e., every time (n−1) processes are completed. Then, the treated equipment testing substrates are housed in the original carrier or a different carrier, and the treated equipment testing substrates are inspected to grasp the state of the treatment equipment. Therefore, since the line for the equipment testing substrates is independent of the line for substrates to be treated, the substrates to be treated pass through the usual line while testing the treatment equipment, so that the treatment equipment can be easily used.

In a batch heat treatment equipment, such as a vertical furnace or a horizontal furnace, if the equipment testing substrates are held in a dummy-substrate holding region out of the substrate holding regions of a holder to be heat-treated, there is no influence on holding regions of substrates to be treated. Therefore, there is no influence on the transfer sequence of the substrates to be treated, so that the heat treatment equipment can be easily used.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 8 is a schematic view illustrating the relationship between a conventional vertical heat treatment equipment and a wafer carrier stocker; and FIG. 9 is a schematic view illustrating the loading of wafers on wafer boats according to a conventional wafer heat-treatment method.

DESCRIPTION OF THE PREFERRED EMBODIMENT

Figure 1:
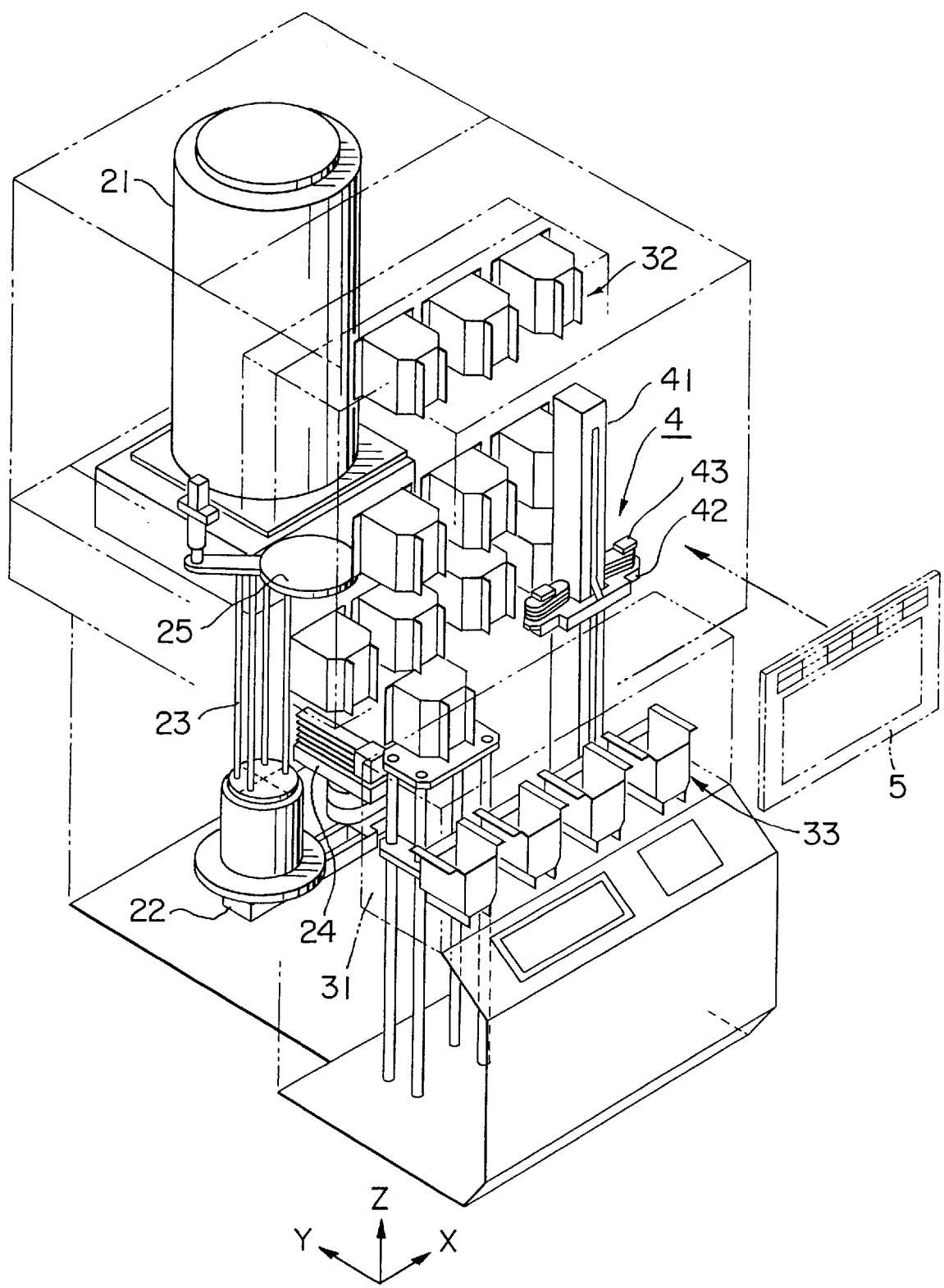
FIG. 1 is a perspective view illustrating the whole construction of a vertical heat treatment equipment applied to a preferred embodiment of a treatment method according to the present invention.
Figure 2:
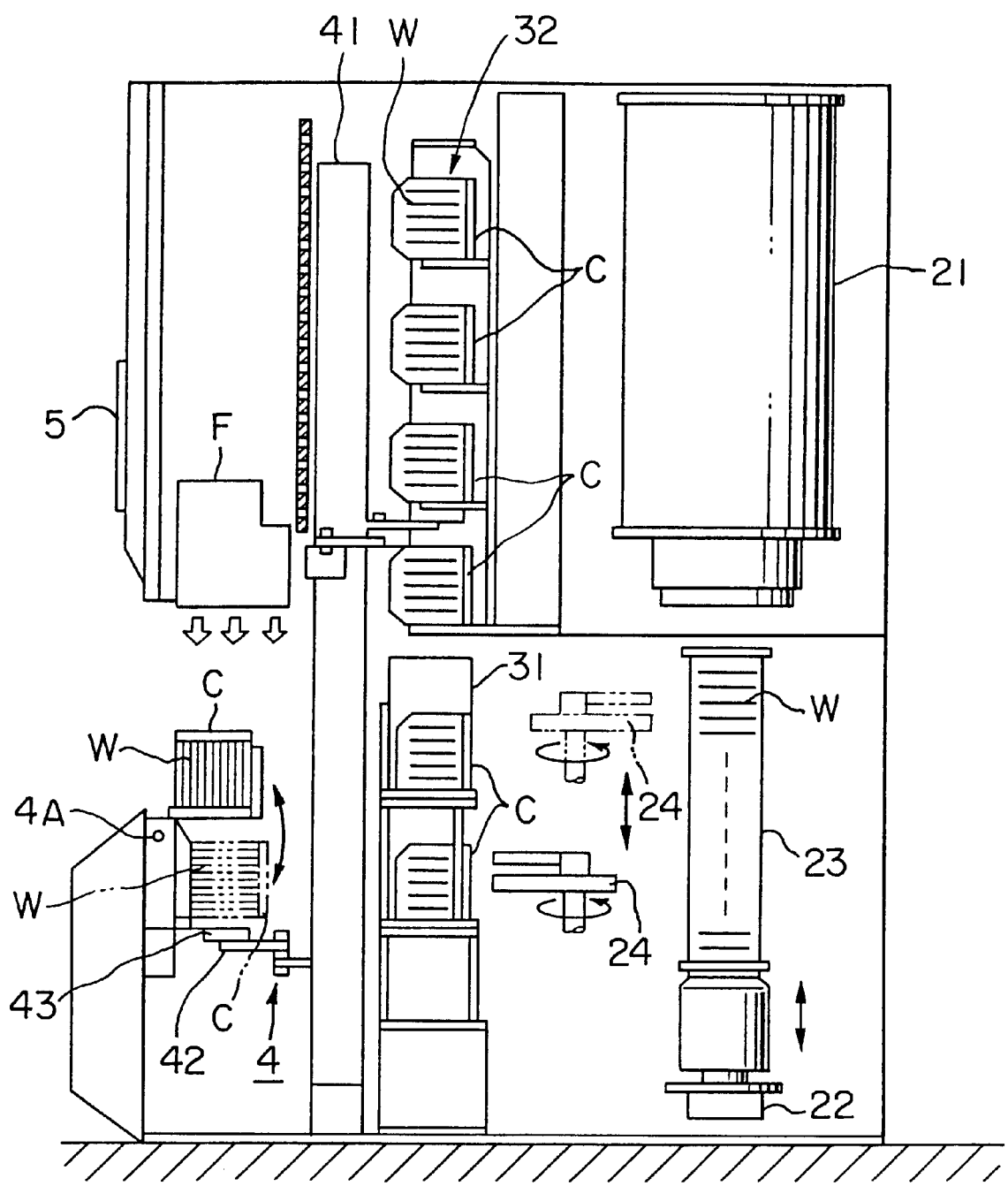
FIG. 2 is a longitudinal section of the vertical heat treatment equipment of FIG. 1.

FIGS. 1 and 2 show the preferred embodiment of a vertical heat treatment equipment according to the present invention. This vertical heat treatment equipment is mounted at the inner part of an equipment body, and comprises: a vertical heat treating furnace 21, which has a reaction tube and a heater surrounding the reaction tube; a wafer boat 23, on which a plurality of substrates to be treated, e.g., semiconductor wafers, are loaded so as to be stacked vertically at regular intervals and which is moved vertically by means of a boat elevator 22 for causing wafers W (see FIG. 2) to be loaded on and unloaded from the heat treating furnace 21; and wafer transfer equipment 24 for detachably mounting the wafers W on the wafer boat 23, the wafer transfer equipment 24 having, e.g., a plurality of pincettes (forks) which are horizontally and vertically movable and rotatable. The vertical heat treatment equipment further comprises a pivotable lid 25 for closing a lower-end opening of the heat treating furnace 21 while the wafers W are transferred between the wafer boat 23 and a carrier C. A wafer delivery portion 31 is arranged so as to face a lower position of each of the wafer boats 23 via the wafer transfer equipment 24 (vertically movable and pivotable). For example, three stages of carriers C for housing the wafers W therein can be put on the wafer delivery portion 31 so as to be arranged vertically.

Above the wafer delivery portion 31, a carrier housing rack (a carrier stocker) 32 is arranged. For example, the carrier housing rack 32 can house therein a maximum of 16 carriers C of four rows in lateral directions and four stages in vertical directions.

In front of the wafer delivery portion 31 and the carrier housing rack 32, a moving region of the carrier transfer equipment 4 is ensured. In front of the moving region, a carrier stage 33 is arranged on the front side of the heat treatment equipment body. The carrier stage 33 serves as an input/output port for carrying the carriers C, which houses the wafers W therein, in and out of the outside of the heat treatment equipment. For example, four carriers C are arranged laterally (in the direction of X in FIG. 1) so that the wafer outlets of the carriers are turned upwards, i.e., so that the wafers are arranged vertically.

Although FIG. 1 shows conceptually a single carrier stage 33, four separate carrier stages are actually provided for the four carriers C, respectively. As shown in FIG. 2, the carriers C mounted on the carrier stages 33 are rotated around a horizontal shaft 4A toward the carrier transfer equipment 4 so as to be arranged horizontally by means of a mechanism combined with the carrier stages 33. The carriers C are transferred in a horizontal state (shown by the chain line in FIG. 2) by means of the carrier transfer equipment 4.

The carrier transfer equipment 4 comprises a lifting plate 42, which is movable vertically along strut 41 being movable in the direction of X in FIG. 1 (in lateral directions), and an arm 43, which is pivotable about the Z axis for holding and transferring the carriers C. In FIG. 2, F denotes an air filter portion for cleaning air in the heat treatment equipment.

Figure 3:
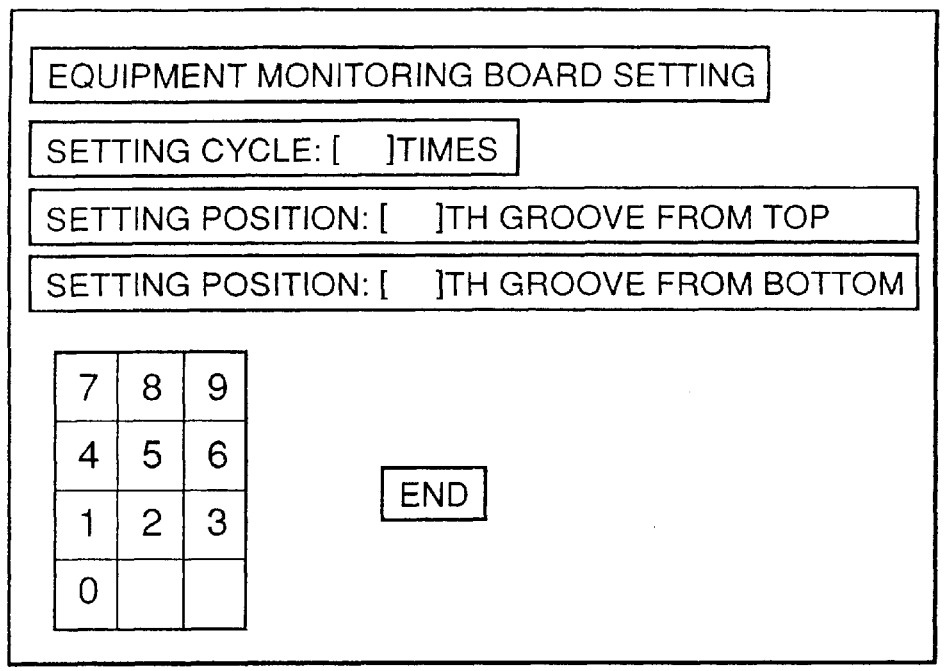
FIG. 3 is a schematic view illustrating an equipment testing parameter setting screen of an operation panel for use in the vertical heat treatment equipment of FIG. 1.

As shown in FIG. 1, the front panel of the equipment body has an operation panel 5 of a touch panel for operating the heat treatment equipment. The operation panel 5 has an equipment testing parameter setting portion, which is a characteristic portion of this preferred embodiment. For example, when a predetermined switch portion on an initial screen is pushed, an equipment testing parameter setting screen shown in FIG. 3 is displayed. On this screen, a setting cycle of an equipment testing wafer, a screen for displaying the setting position of the equipment testing wafer, a ten key and an end switch are displayed.

Figure 4:
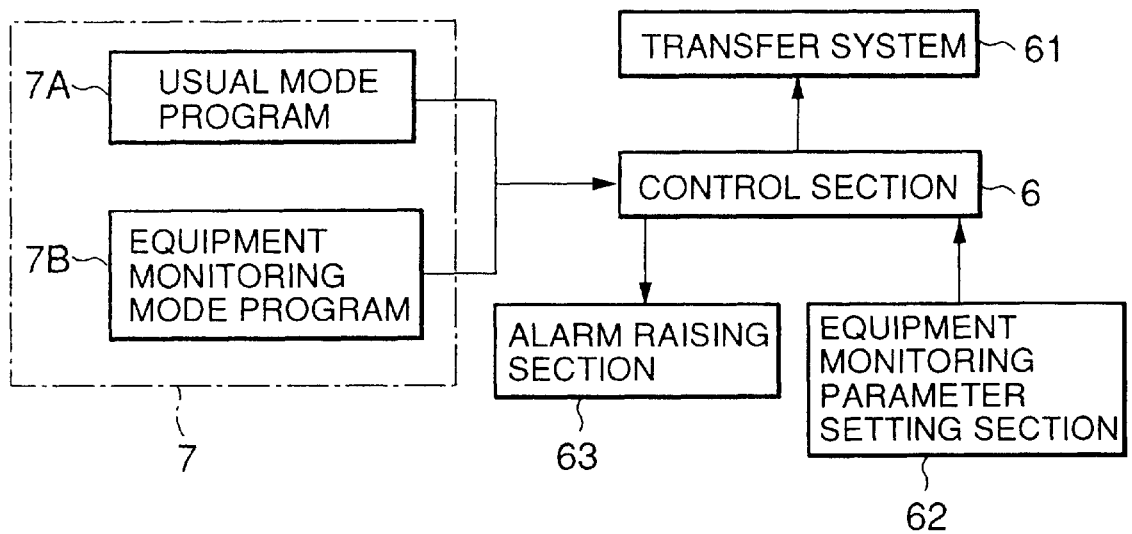
FIG. 4 is a block diagram of a control system of the vertical heat treatment equipment of FIG. 1.

Referring to FIG. 4, a control system of the preferred embodiment of the heat treatment equipment, according to the present invention, will be described below.

The control system of the heat treatment equipment comprises a control section 6 including a CPU, and a storing section 7 including a usual mode program 7A and an equipment testing mode program 7B. The usual mode program 7A is a program for carrying out a usual heat treatment, and the equipment testing mode program 7B is a program for loading an exclusive equipment testing wafer, which tests the heat treatment equipment, together with the wafers to be treated, on the wafer boat 23 in a predetermined cycle (which may be, e.g., every time, ten times or one time) to carry out heat treatment. In FIG. 4, a transfer system 61 comprises the wafer transfer equipment 24 and the carrier transfer equipment 4. The control section 6 controls the transfer system 61 on the basis of the programs 7A and 7B. The equipment testing mode program 7B is selected by means of an equipment testing parameter setting section 62, i.e., by setting the equipment testing mode on the screen shown in FIG. 3 in the case of this example. An alarm raising section 63 is provided for raising the alarm to inform the operator that the heat treatments of all the equipment testing wafers in the exclusive equipment testing carrier C are completed.

With this construction, the operation of the preferred embodiment of a heat treatment equipment, according to the present invention, will be described below.

First, it will be described that the heat treatment of the wafers is carried out in the usual mode without setting the equipment testing mode. In this case, a series of processes are carried out on the basis of the usual mode program 7A in the storing section 7 shown in FIG. 4. That is, the carrier C housing therein, e.g., 25 wafers, is carried in the carrier stage 33 shown in FIG. 1, and transferred to the delivery rack 31 directly or after being temporally housed in the carrier housing rack 32 by means of the carrier transfer equipment 4.

Then, the wafers W are taken out of the carrier C, which is mounted on the delivery rack 31, to be transferred to the wafer boat 23 by means of the wafer transfer equipment 24, one by one or each set of plural wafers. The wafer boat 23 has several (e.g., four) vertical struts, each of which is formed with, e.g., 125 grooves, so as to be capable of holding 125 wafers W. Since the holding regions at the upper and lower end portions of the wafer boat 23 have a lower temperature than those of the intermediate holding regions between the upper and lower end portions, it is programmed that the holding regions at the upper and lower end portions hold dummy wafers.

Therefore, wafers to be treated are held in the intermediate holding regions other than the upper and lower end portions of the wafer boat 23, and monitor wafers are usually loaded in the holding regions for the wafers to be treated, at regular intervals so as not to change usual process conditions. The monitor wafers are the same as conventional monitor wafers for monitoring the treated state of the wafers to be treated, and distinguished in their function from the equipment testing wafers in this preferred embodiment. For example, a monitor wafer is preliminarily loaded in the carrier C housing therein the wafers to be treated. The dummy wafers are housed in an exclusive dummy-wafer carrier, which is housed in the carrier housing rack 32 at a designated position.

After the loading of the wafers W on the wafer boat 23 is completed, the wafer boat 23 is moved upwards by means of the boat elevator 22 to be loaded in the heat treating furnace 21. In the furnace, predetermined heat treatments, such as oxidation, CVD and diffusion, are carried out with respect to the wafers W. Thereafter, the wafer boat 23 is moved downwards so that the wafers W are unloaded from the furnace, and the wafers W are transferred from the wafer boat 23 to the carrier C of the wafer delivery portion 31 by means of the wafer transfer equipment 24. In accordance with the empty state of the carrier housing rack 32, the carrier C housing therein the treated wafers W is temporally housed in the carrier housing rack 32 or directly transferred to the carrier stage 33 to be carried out of the heat treatment equipment.

The heat treatment in the equipment testing mode will be described below.

In this preferred embodiment, the exclusive carrier C housing therein 25 equipment testing wafers W is preliminarily housed in the carrier housing rack 32 of the heat treatment equipment. The equipment testing wafers W are used for inspecting the state of the heat treatment equipment, e.g., the contaminated state due to particles and so forth in the heat treatment equipment, the deterioration of a heater, and the flow of a process gas. Therefore, since the equipment testing wafers W are not used for inspecting the treated state of the wafers to be treated, the equipment testing wafers W are not required to be the same as the wafers to be treated. However, they may be the same as the monitor wafers. For example, the equipment testing wafers W may be special wafers, in which an electrode or the like is embedded for inspecting the pressure proof of a film. For example, these special wafers may be those shown in U.S. Pat. Nos. 5,377,071 or 5,515,145. Any wafer may be utilized as long as it has some way to gather information about the parameters to be tested in regard to the operation of the treatment equipment. The inspection of the wafers is conducted after the wafer is removed from the heat treating equipment.

Although the exclusive equipment testing carrier C housing therein the equipment testing wafers W does not have a special structure, it is distinguished from the carrier housing the wafers to be treated. That is, the equipment testing wafers W are housed in another carrier, which is different from the carrier housing therein the wafers to be treated, which passes through a usual line.

First, in order to operate the heat treatment equipment in the equipment testing mode, the equipment testing mode setting switch is pushed on the equipment testing parameter setting screen of the operation panel 5 shown in FIG. 3, and the setting cycle (setting intervals) and the setting position of the wafer boat in the groove are inputted by means of the ten key on the same screen. The setting cycle means the number of times of processes for loading the equipment testing wafers on the wafer boat 23 to carry out the treatment, with respect to the number of times of the processes for loading the wafers W on the wafer boat 23 to carry out the treatment in the heat treating furnace 21. For example, if the setting cycle is four times, three times of usual processes are carried out without loading the equipment testing wafers, and thereafter, the next process is carried out while loading the equipment testing wafers on the wafer boat 23. The setting position means the position of the holding groove of the wafer boat 23 at which the equipment testing wafer should be loaded, i.e., which number of the holding grooves the equipment testing wafer should be loaded in.

Figure 5:
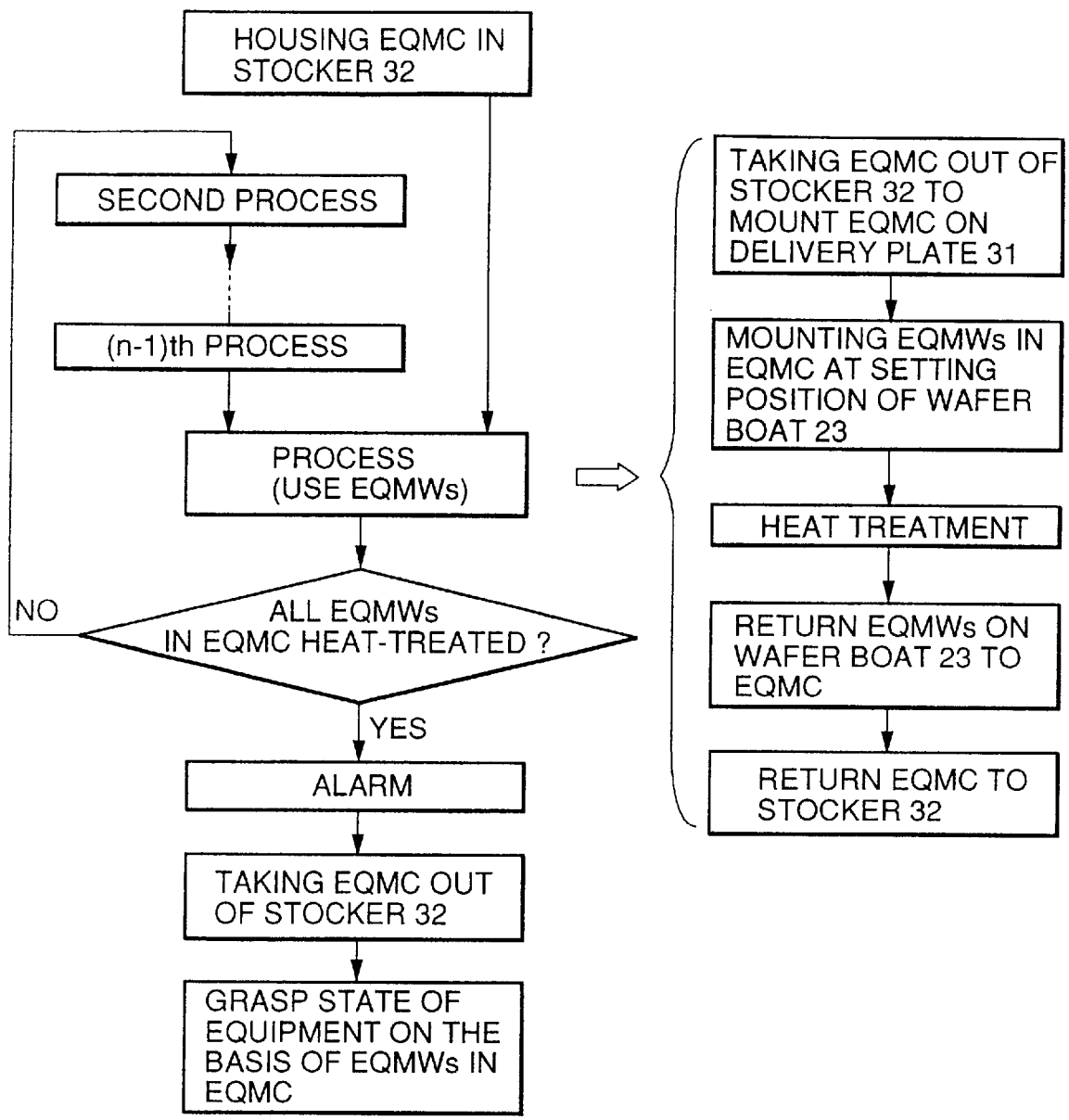
FIG. 5 is a flow chart showing the treatment in an equipment testing mode by a treatment method according to the present invention.

Thus, if the equipment testing mode is set, the equipment testing mode program 7B shown in FIG. 4 is selected. FIG. 5 shows a flow chart showing the flow in the equipment testing mode. First, in a first process, the carrier housing therein the equipment testing wafers (the equipment testing carrier) is taken out of the carrier housing rack 32 shown in FIG. 1 to be transferred to the delivery rack 31 by means of the carrier transfer equipment 4, and the equipment testing wafers are transferred from the equipment testing carrier to be loaded at the setting position of the wafer boat 23 by means of the wafer transfer equipment 24.

Figure 6:
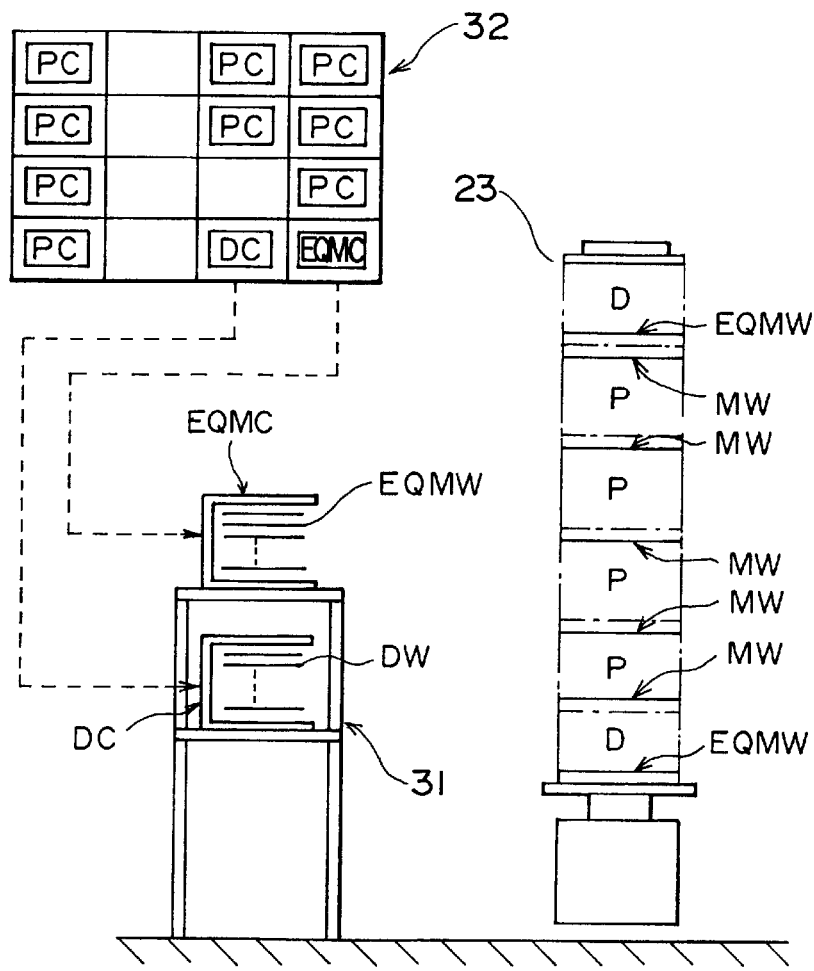
FIG. 6 is a schematic view explaining the flow of wafers in the treatment in the equipment testing mode of FIG. 5.

This state is schematically shown in FIG. 6. For example, an equipment testing carrier (EQMC) and a carrier (dummy carrier) (DC) housing therein a dummy wafer (DW) are transferred from the carrier housing rack 32 to the delivery rack 31. In FIG. 6, PC means carriers housing therein wafers to be treated.

Predetermined stages from the top of the wafer boat 23 and predetermined stages from the bottom thereof serve as dummy-wafer holding regions. In these holding regions, the dummy wafers (DW) are loaded. The equipment testing wafers (EQMW) are loaded at preset positions, e.g., at the bottom of the holding regions for holding the respective dummy wafers (DW) on the upper and lower end sides of the wafer boat 23. At this position, the parameters of the heating equipment can be tested without unnecessarily taking up a space which can be filled with a wafer to be treated, thus preventing any loss of production.

The wafers (PW) to be treated are loaded in intermediate regions between the upper and lower holding regions of the dummy wafers (DW). As described above, in the holding regions of the wafers (PW) to be treated, the usual monitor wafers (MW) are also loaded at regular intervals. In FIG. 6, the regions D surrounded by the chain line are the holding regions for holding dummy wafers (DW), and the regions P surrounded by the chain line are the holding regions for holding wafers (PW) to be treated. Subsequently, after the transfer of wafers W to the wafer boat 23 is completed, a first process (heat treatment) is carried out in the furnace in the same manner as the usual mode as shown in FIG. 5. Then, the equipment testing wafers (EQMW) arranged on the wafer boat 23 are returned to the original equipment testing carrier (EQMC), and the equipment testing carrier (EQMC) is returned to the original position of the carrier housing rack 32. Subsequently, a second process is carried out. If the setting cycle "n" is, e.g., "4", a (n–1)th process, i.e., a third process in this case, is carried out in the same manner as the usual mode without using the equipment testing wafers (EQMW). In a fourth process, heat treatment is carried out using the equipment testing wafers (EQMW) similar to the first process.

After all the equipment testing wafers (EQMW) in the equipment testing carrier (EQMC) are heat-treated, an alarm command is outputted from the control section 6 to the alarm raising section 64, and the alarm raising section produces, e.g., a warning sound (alarm). Thereafter, the equipment testing carrier (EQMC) is automatically or manually taken out of a host computer side to the carrier stage 33 to be carried in an inspection equipment which is arranged outside the heat treatment equipment. With respect to the equipment testing carrier (EQMC), e.g., inspection of particles, pressure test of insulating films, and/or inspection of in-plane uniformity of film thicknesses are carried out, so that particular determination is carried out for grasping the state of the heat treatment equipment.

Figure 7:
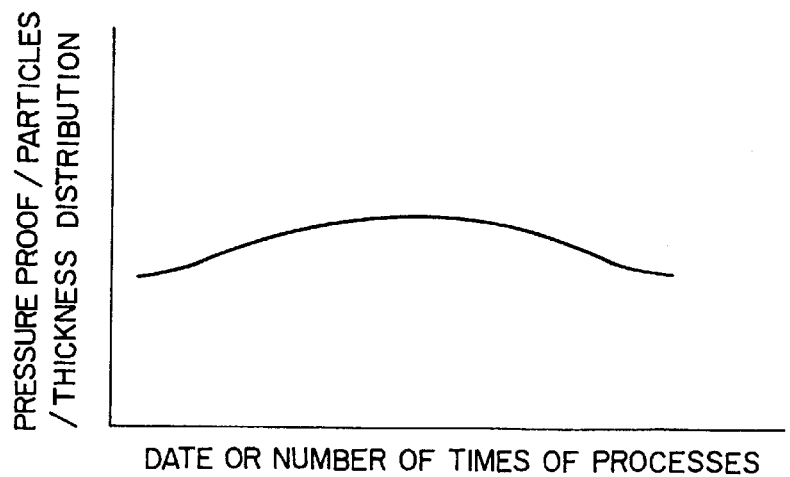
FIG. 7 is a graph of an example of a method for inspecting the state of the equipment on the basis of equipment testing wafers according to the present invention.

In order to grasp the state of the heat treatment equipment, the deterioration with age of particular factors, such as the number of particles, are grasped as shown in FIG. 7. Then, on the basis of the data of the deterioration with age, the state of the heat treatment equipment at the present time, the tendency in future, and the identification of a product the state of which was bad in the past, are grasped.

According to this preferred embodiment, heat treatment is carried out using the exclusive equipment testing wafers which tests the state of the heat treatment equipment, and on the basis of the results, the state of the heat treatment equipment is grasped. The testing occurs off line and may utilize either standard wafers or special wafers, as long as the parameters of the heat treating equipment are measured. Therefore, it is possible to find trouble areas of the heat treatment equipment early and it is possible to predict the maintenance time. In addition, the heat treatment equipment of the present invention is useful for working the future projects and is very convenient.

According to the present invention, since the equipment testing wafers (EQMW) pass through the independent line separated from the line for the usual wafers (PW) to be treated, the line for the equipment testing wafers (EQMW) has no influence on the line for the usual wafers (PW) to be treated. In addition, since the treating cycle of the equipment testing wafers (EQMW) and the setting positions thereof on the wafer boat 23 can be automatically set, the operation is not complicated, so that the working can be easily carried out. Moreover, since the exclusive equipment testing wafers (EQMW) separated from the usual monitoring wafers are used, it is possible to use special wafers, such as wafers in which electrodes are embedded, or standard wafers may be utilized, as long as the parameters of the heat treatment equipment are measured. In addition, since the equipment testing wafers (EQMW) can be held in the dummy-wafer holding region (D) on the wafer boat 23, the equipment testing wafers (EQMW) do not occupy the holding regions for the wafers (PW) to be treated, so that the equipment testing wafers (EQMW) have no influence on the transfer sequence of the wafers (PW) to be treated.

As described above, the present invention is useful for testing the treated state of an object to be treated, e.g., a vertical heat treatment equipment for semiconductor wafers, using equipment testing substrates housed in an exclusive carrier.

The carrier for housing therein untreated equipment testing wafers may be separated from the carrier for housing therein treated equipment testing wafers. While the present invention has been applied to a vertical heat treating furnace, the invention should not be limited thereto, but the invention may be applied to a horizontal heat treating furnace.

As described above, according to the present invention, the substrates for exclusively testing the heat treatment equipment are used, and the substrates are controlled by a line independent of the line for the substrates to be treated. Therefore, it is possible to test the state of the heat treatment equipment, and the working can be very easily carried out.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for treating a treatment substrate, said method comprising:

providing a treatment substrate to be treated, a substrate monitoring substrate serving to monitor a state of the treatment substrate to be treated, and an equipment testing substrate serving to test a state of the treatment equipment;

setting a treating cycle (n) of the equipment testing substrate, such that said treating cycle is carried out following (n−1) of treatment substrate processing cycles;

taking said equipment testing substrate out of an exclusive carrier to provide said equipment testing substrate to said treatment vessel to treat said equipment testing substrate therein in the equipment testing substrate treating cycle during a treating of said treatment substrate to be treated;

carrying the treated equipment testing treatment substrate in said exclusive carrier; and testing a state of said treatment equipment on the basis of the treated state of said treated equipment testing treatment substrate carried in said exclusive carrier.

2. A method for treating a plurality of treatment substrates to be treated with a treatment equipment, which are carried in a reactor vessel, the substrates to be treated being held in a holder so as to be stacked at regular intervals, and which are subjected to a predetermined heat treatment in the reactor vessel, the method comprising the steps of:

providing the treatment substrates to be treated, a plurality of substrate monitoring substrates serving to monitor a state of the substrates to be treated, and an equipment testing substrate serving to test a state of the treatment equipment, setting a treating cycle (n) of the equipment testing substrate, such that said treating cycle is carried out following (n−1) treatment substrate cycles of being carried out;

taking said equipment testing substrate out of an exclusive carrier to allow said equipment testing substrate to be held in a holder, to provide said equipment testing substrate to a treatment vessel to treat said equipment testing substrate therein in the treating cycle occurring during a step of treating said substrates to be treated;

carrying the treated equipment testing substrate in said exclusive carrier; and testing a state of said treatment equipment on the basis of the treated state of said treated equipment testing substrate carried in said exclusive carrier.

3. A method for treating a plurality of substrates to be treated held by a holder, where the holder holds the substrates to be treated and a dummy substrate so as to be stacked at regular intervals and the holder is carried in a reactor vessel of a treatment equipment to carry out a predetermined heat treatment of the substrates to be treated, the method comprising the steps of:

providing a substrate to be treated, a substrate monitoring substrate serving to monitor a state of the substrate to be treated as the dummy substrate, and an equipment testing substrate serving to test a state of the treatment equipment, setting a treating cycle of the equipment testing substrate, said treating cycle involving multiple times of a processing cycle of the substrates to be treated;

causing said equipment testing substrate to be held at a dummy-substrate holding region of said holder, to provide said equipment testing substrate in said reactor vessel to treat said equipment testing substrate therein in the treating cycle during a step of treating said substrates to be treated; and testing a state of said treatment equipment on the basis of the treated state of said treated equipment testing substrate.

4. A treatment equipment for treating a treatment substrate to be treated, said treatment equipment comprising:

a reactor vessel which receives the treatment substrate;

an equipment testing parameter setting section for setting a treating cycle of an equipment testing substrate serving to test a state of the treatment equipment said treating cycle involving multiple times of a processing cycle for said treatment substrates to be treated;

a carrier for housing therein said equipment testing substrate; and a control section for controlling a transfer system so that said equipment testing substrate housed in said carrier is held in a holder to be treated in a preset treating cycle during a step of treating said substrate to be treated.

5. The treatment equipment according to claim 4, which further comprises an alarm raising section for raising the alarm when all the equipment testing substrates (EQMW) in said equipment testing carrier (EQMC) are treated.

6. The treatment equipment according to claim 4, wherein the treatment equipment is a vertical heat treatment equipment.

7. The treatment equipment according to claim 4, wherein the treatment equipment is a horizontal heat treatment equipment.

8. A treatment equipment for treating a plurality of substrates to be treated held by a holder, where the holder holds the substrates to be treated and a dummy substrate so as to be stacked at regular intervals and the holder is carried in a reactor vessel to carry out a predetermined heat treatment of the substrates to be treated, said treatment equipment comprising:

an equipment testing parameter setting section for setting a treating cycle of an equipment testing substrate serving to test a state of the treatment equipment said treating cycle involving multiple times of a processing cycle for said treatment substrates to be treated;

a carrier for housing therein said equipment testing substrate; and a control section for controlling a transfer system so that said equipment testing substrate housed in said carrier is held in a holder to be treated in the treating cycle during a step of treating said substrates to be treated.

9. The treatment equipment according to claim 8, wherein said equipment testing parameter setting section (62) also set the number and positions of said equipment testing substrate (EQMW) held in the holder (23).

* * * * *